United States Patent
Marcath et al.

(10) Patent No.: US 9,774,179 B1
(45) Date of Patent: Sep. 26, 2017

(54) FUSED T-SPLICE WIRING

(71) Applicant: FORD GLOBAL TECHNOLOGIES, LLC, Dearborn, MI (US)

(72) Inventors: Jason C. Marcath, Dearborn, MI (US); Zubair Hassan, Canton, MI (US); Hagop J. Parnoutsoukian, Dearborn, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 0 days.

(21) Appl. No.: 15/473,807

(22) Filed: Mar. 30, 2017

(51) Int. Cl.
| | |
|---|---|
| *H01H 85/04* | (2006.01) |
| *H01R 11/01* | (2006.01) |
| *H01R 13/684* | (2011.01) |
| *H02G 15/10* | (2006.01) |
| *H05K 5/04* | (2006.01) |
| *H05K 5/06* | (2006.01) |
| *H02G 15/08* | (2006.01) |
| *H05K 9/00* | (2006.01) |
| *H05K 5/00* | (2006.01) |
| *H01R 9/05* | (2006.01) |
| *H01H 85/02* | (2006.01) |

(52) U.S. Cl.
CPC ...... *H02G 15/085* (2013.01); *H01H 85/0241* (2013.01); *H01H 85/04* (2013.01); *H01R 9/0509* (2013.01); *H01R 11/01* (2013.01); *H01R 13/684* (2013.01); *H02G 15/10* (2013.01); *H05K 5/0004* (2013.01); *H05K 5/04* (2013.01); *H05K 5/06* (2013.01); *H05K 9/0045* (2013.01)

(58) Field of Classification Search
CPC .. H02G 15/085; H02G 15/10; H01H 85/0241; H01H 85/04; H01R 11/01; H01R 13/684; H05K 5/04; H05K 5/06; H05K 9/0045

USPC ......................................................... 174/377
See application file for complete search history.

(56) References Cited

U.S. PATENT DOCUMENTS 2,453,314 A * 11/1948 Hammerly ............. H01R 13/68
174/129 B
3,281,558 A * 10/1966 Weber .................... H01R 13/68
337/188

(Continued)

FOREIGN PATENT DOCUMENTS

| CN | 101800091 A | 8/2010 |
|---|---|---|
| CN | 102592718 A | 7/2012 |

(Continued)

OTHER PUBLICATIONS

T Type Quick Splice Crimp, https:www.aliexpress.com/item/10pcs-lot-L1-Blue-T-Type-Quick-Splice-Crimp-Terminal-Wire-Convenient-Connector-For-1-2/32653250495.html?spm+211 . . . .

*Primary Examiner* — Timothy Thompson
*Assistant Examiner* — Michael F McAllister
(74) *Attorney, Agent, or Firm* — Frank A. MacKenzie; MacMillan, Sobanski & Todd, LLC

(57) ABSTRACT

A power distributor including a first conductive coupling device electrically coupled to a bare-wire non-terminating section of a first conduit. A second conductive coupling device is electrically coupled to a terminating end of a second conduit. The first conduit is a larger gauge than the second conduit. A fuse electrically connects the first conductive coupling device and the second conductive coupling device. A housing encases the first and second conductive coupling devices and the fuse.

20 Claims, 3 Drawing Sheets

(56) References Cited

U.S. PATENT DOCUMENTS

| | | | |
|---|---|---|---|
| 5,316,502 A * | 5/1994 | Loet | H01H 85/201 |
| | | | 439/620.26 |
| 8,604,342 B2 | 12/2013 | Solon | |
| 2011/0209741 A1* | 9/2011 | Solon | H01H 85/0241 |
| | | | 136/244 |
| 2014/0083763 A1 | 3/2014 | Payne, III | |
| 2016/0134096 A1 | 5/2016 | Kett et al. | |

FOREIGN PATENT DOCUMENTS

| | | |
|---|---|---|
| CN | 202601848 U | 12/2012 |
| EP | 1575136 A2 | 9/2005 |

\* cited by examiner

FUSED T-SPLICE WIRING

CROSS REFERENCE TO RELATED APPLICATIONS

Not Applicable.

STATEMENT REGARDING FEDERALLY SPONSORED RESEARCH

Not Applicable.

BACKGROUND OF INVENTION

The present invention relates generally to wiring harnesses, and more specifically high voltage wiring harnesses.

In both electric vehicles and hybrid vehicles that utilize electric drive motors, high voltage (HV) is required to energize the motor and other components of the vehicle. The term HV used herein are power supply systems that can generate voltages typically in the range of 280V to 650V.

A high voltage wiring (e.g., 8 gauge or lower) is used to distribute HV power distribution. If HV power is required at different locations of the vehicle, then a main HV wire is branched to deliver the HV power to the two separate locations. In such an example, a splitter box is required to take one wire and split it into two outputs. As a result, there will be an input wire that splits into two output wires. All three wires utilized must be of the same gauge. If a different gauge wire is used, then a fuse must be used as well.

Within the junction box, the primary HV distribution wire is cut and is coupled to two or more HV output wires. Such systems utilize various components as clamps, bolts, and terminals to couple the primary HV input wire to the plurality of HV output wires that adds additional components and cost. Moreover, the junction box is sized to accommodate the various input and output wires and other components used to isolate these connections from other components of the vehicle. While this provides for adequate re-distribution of power, junction boxes are sized to accommodate the hardware and are often large and difficult to package when space is limited. Moreover, if any output wires of a lesser gauge wiring is used, then a separate fuse holder must be incorporated somewhere within the branch wire to protect against overloading the circuit.

SUMMARY OF INVENTION

In one aspect of the invention, a power distributer is provided that enables high voltage power to be obtained from a main high voltage conduit without having to cut the conducting wire of the main high voltage conduit. The power distributer allows power to be branched from the main high voltage conduit at any location of the main high voltage conduit. This alleviates the requirement of routing the high voltage conduit to a junction box that is remote from the where the branch conduit is routed, which reduces the cost of wiring, and alleviates the need to reserve a packaging space of a typical power distribution junction box. The power distributor includes a housing encasing a first conductive coupling device electrically coupled to the main high voltage conduit and a second conductive coupling device electrically coupled to a branch conduit. The first conductive coupling device is electrically secured to the main high voltage conduit without having to cut the conductive wiring of the main high voltage conduit by removing only a jacket, sheath, and insulator at a non-terminating section of the main high voltage conduit thereby exposing a bare wire for attachment to the main high voltage conduit. A removable fuse couples both the first and second conductive coupling devices for providing power to the branch conduit. The integration of the fuse further provides an advantage of using a lower gauge wire in the branch conduit relative to the main high voltage conduit. The junction of the main high voltage conduit and branch conduit is encased in a T-shaped weather resistant housing, which also provides electromagnet shielding to exterior elements.

An embodiment contemplates a power distributor that includes a first conductive coupling device electrically coupled to a bare-wire non-terminating section of a first conduit. A second conductive coupling device is electrically coupled to a terminating end of a second conduit. The first conduit is a larger gauge than the second conduit. A fuse electrically connects the first conductive coupling device and the second conductive coupling device. A housing encases the first and second conductive coupling devices and the fuse.

DETAILED DESCRIPTION

Figure 1:
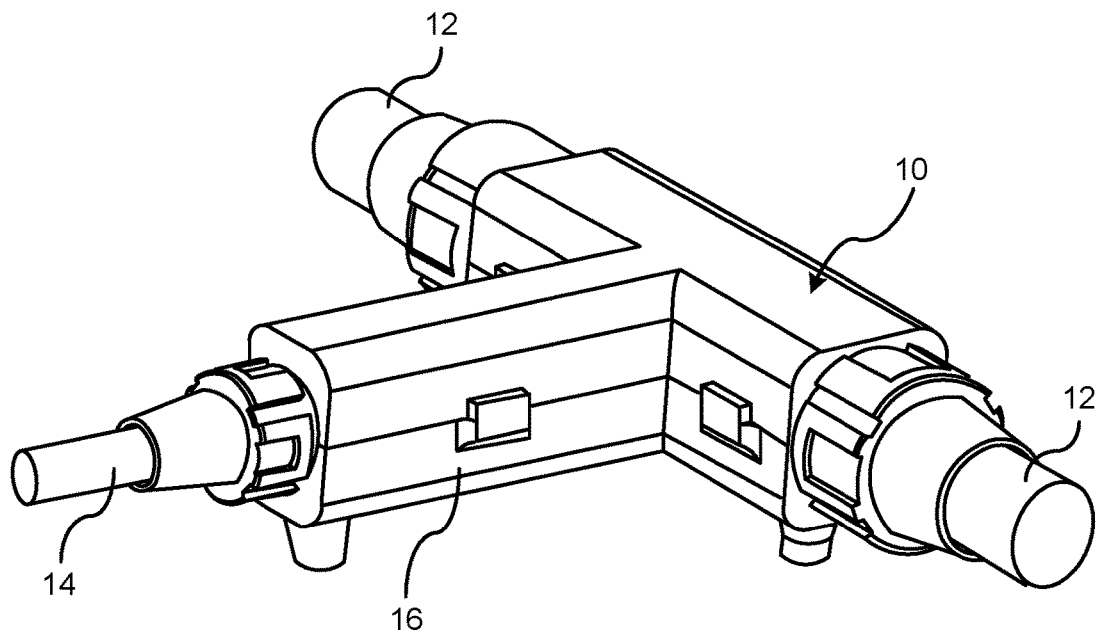
FIG. 1 illustrates a cross section view of a power distributer.

There is shown in FIG. 1 a cross section view of an a power distributer 10 for branching power from a main high voltage (HV) conduit 12 to a branch conduit 14 within a housing 16 without having to cut the conducting main HV conduit 12.

Figure 2:
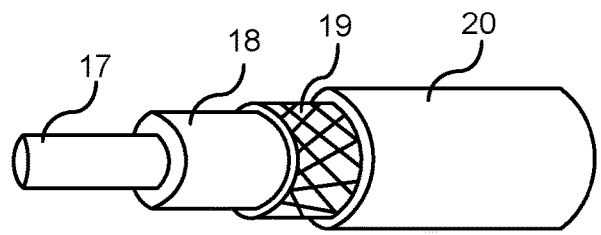
FIG. 2 illustrates a cut-away view of an exemplary high voltage wire.

FIG. 2 illustrates a cut-away view of an exemplary high voltage wire. A conducting wire 17 of the high voltage wire includes strands of a conducting metal (e.g., copper) formed at an innermost layer of the high voltage wire. An insulator 18 is formed co-axial and outward from the inner layer for insulating the conducting wire 17. A shield 19 is formed co-axial and outward to the insulator 16. The shield 19 is typically a braided metal and provides emf protection to objects exterior of the high voltage wire. A jacket 20 is formed co-axially outward from the shield. The jacket 20 is typically made from a plastic material and functions to secure the internal layers therein as well as protect the internal layers from environmental conditions.

Figure 3:
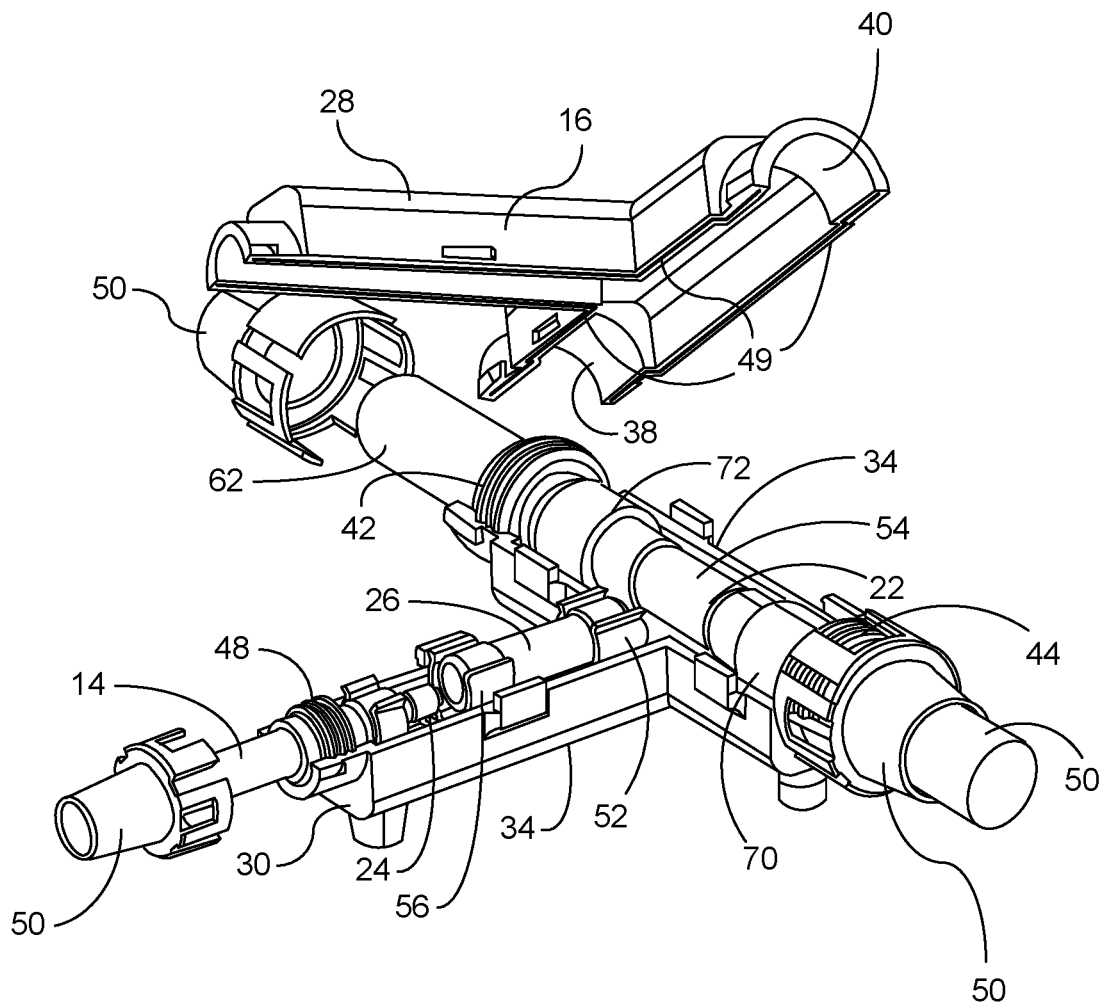
FIG. 3 illustrates a partial exploded view of the power distributer.
Figure 4:
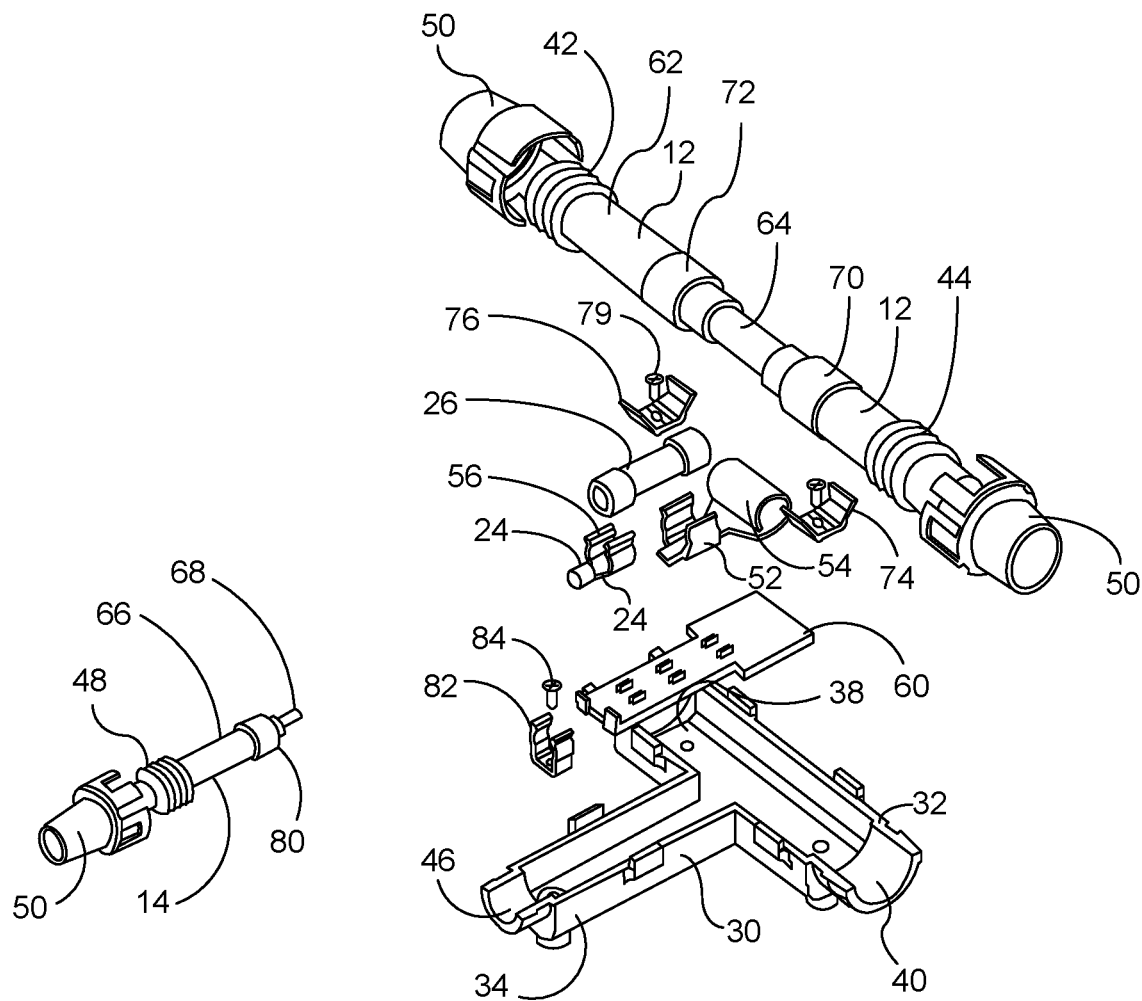
FIG. 4 illustrates a fully exploded view of the power distributer.

Referring to FIGS. 3 and 4, a partial exploded view and full exploded view are shown, respectively, to illustrate the internal components within the power distributer 10. Disposed within the housing 16 of the power distributer 10 includes a first conductive coupling device 22, a second conductive coupling device 24, a fuse 26, a plurality of EMC grounding elements, and a plurality of sealing elements.

The housing 16 functions as a covering that shields and insulates internal components disposed within the housing 16. The housing 16 is preferably a two-piece construction having a first housing portion 28 and a second housing portion 30. The first housing portion 28 and the second housing portion 30 are preferably secured together by a snap connection that includes interlocking elements; however, it should be understood that other fastening elements may be used to secure the housings portions together that include, but are not limited to, bolts, screws, clips, clamps, latches, or nuts. The type of fastening element utilized allows access to the internal components within the housing 16. Alternatively, the first housing portion 28 and the second housing portion 30 may be produced as a clamshell housing using a hinged joint formed between the respective housing portions.

The first housing portion 28 and second housing portion 30 are preferably made from a selective metal which serves as electromagnetic compatibility (EMC) shielding of the internal components within the housing 16. Alternatively, the first housing portion 28 and the second housing portion 30 can be made of other materials including, but not limited to, PolyEtherEtherKetone (PEEK) Themoplastics, Polypropylene (PP), PVC, PTFE, PET, PES, PEI, ECTFE, PBT, FEB. If a plastic-type material is utilized, then an internal EMC shield must be incorporated within the housing for EMC shielding.

The first housing portion 28 and second housing portion 30 when secured together forms a T-shaped configuration housing that includes a first body section 32 and a second body section 34. While a T-shaped configuration is shown, it is understood that other shapes and configurations may be utilized without deviating from the scope of the invention. The first body section 32 includes a first aperture 38 and a second aperture 40 where the main HV conduit 12 enters the housing 16 through the first aperture 38 and exits the housing 16 through the second aperture 40. A first sealing element 42 is disposed near the first aperture 38 and a second sealing element 44 is disposed near the second aperture 40 for environmentally sealing the housing 16 where the main HV conduit 12 enters and exits the first aperture 38 and second aperture 40, respectively. The first sealing element 42 and second sealing element 44 are preferably made from a rubber-type element and are fitted around a circumference of the main HV conduit 12 for creating a weather-tight seal between the main HV conduit 12 and the housing 16. Alternatively, it should be understood that a housing section formed near the apertures may be toleranced to form a seal about the main HV conduit thereby not having to use separate seal elements.

The second body section 34 is preferably orthogonal to the first body section 32. The second body section 34 includes a third aperture 46 for receiving the branch conduit 14 there through. The branch conduit 14 is received in the third aperture 46 and terminates within the second body section 34. The third aperture 46 of the housing 16 includes a third sealing element 48, for environmentally sealing the housing 16 where the branch conduit 14 enters the third aperture 46. Similarly, a respective housing section formed near the third aperture may be toleranced to form a seal about the branch conduit thereby not having to use a separate seal element. The second body section 36 further houses the fuse 26 for electrically coupling the branch conduit 14 to the main HV conduit 12.

In addition to the sealing elements disposed around the respective conduits for sealing water from entering the apertures, sealing elements 49 are disposed along mating edges between the first housing portion 28 and second housing portion 30. The sealing elements 49 seal the mating edges to prevent water and other environmental contaminants from entering the power distributer 10.

A plurality of end caps 50 are disposed over the first opening 38, second opening 40, and third opening 46 for retaining each of the sealing elements within the housing. Each respective end cap is preferably conical shaped, however, it is understood that other shapes may be used, and is slidingly displaced over are respective conduit until each respective end cap couples to a respective housing section around each aperture.

As shown in FIGS. 2 and 3, the first coupling device 22 and second coupling device 24 cooperatively form a fuse holder. The first conductive coupling device 22 includes a first end section 52 for receiving and retaining a conducting end of the fuse 26 and a second end section 54 for electrically coupling to the main HV conduit 12. The second conductive coupling device 24 includes a first end section 56 for receiving an opposite conducting end of the fuse 26 and a second end portion 58 for electrically coupling to a terminal end of the branch conduit 14. The first conductive coupling device 22 and the second conductive coupling device 24 are seated on a non-conducting fuse mounting plate 60 that electrically isolates the first conductive coupling device 18, second conductive coupling device 18, and fuse 26 from the housing 16. The non-conductive mounting plate 60 is preferably made of a plastic material; however, the non-conductive mounting plate 60 may be made of any non-conductive material that electrically isolates the respective coupling devices and fuse from the second housing portion 14.

The following provides a description for electrically coupling the branch conduit 14 to the main HV conduit 12 without having to cut the conducting wire of the main HV conduit 12. As described earlier, the conducting portion of the main HV conduit 12 is encased by an insulator, sheath, and jacket. A respective section of the insulator, sheath, and jacket within the housing 16 that is orthogonally aligned with the branch wire 14 is removed thereby exposing an underlying bare wire 64 of the main HV conduit 12. Only a predetermined axial length of the insulator, sheath, and jacket 62 is removed such that no exposed bare wire 64 extends outside of the housing 16. Removal of the jacket 62 and other underlying components allows voltage to be tapped directly from the exposed bare wire 64 without having to actually cut the bare wire 64 within the housing 16. The second end section 54 of the first conductive coupling device 22 is secured to the exposed bare wire 64 where the jacket 62 and other underlying components are removed. The first conductive coupling device 22 is preferably formed from copper which has good conductive properties, however, it should be understood that other materials having sufficient conductive properties may be utilized. Preferably, the second of end section 34 is formed is a flat metal blank and is rolled and crimped for coupling to the main HV conduit 12. Alternatively, the second end section 34 may be formed as a sleeve inserted and positioned over the exposed bare wire 64 of the main HV conduit 12 and crimped and/or welded. It should be understood that other methods may be used to both electrically and structurally retain the second end section to the exposed bare wire such as by welding and/or crimping. For example, a weld operation may be used where a molten solder connection is made or an ultrasonic weld can be used.

As shown in FIG. 4, an outer insulation jacket 66 and other underlying components of the branch conduit 14 is stripped off the terminal end such that a predetermined axial length of bare wire 68 is exposed on the ranch conduit 14. The second end section 58 of the second conductive coupling device 24 is secured to the terminal end of the exposed bare wire 68 where the jacket 66 and other underlying components are removed. The second conductive coupling device 24 may be secured to the bare wire 68 of the branch conduit 14 by crimping and/or soldering as described earlier.

The first conductive coupling device 22 and the second conductive coupling device 24 disposed within the housing 16 are electrically coupled via the fuse 26. The fuse 26 is removable such that should the fuse become blown, the fuse 26 may be accessed within the housing and may be replaced without having to replace the entire power distributer 10. With the incorporation of the fuse 26 in a circuit of the branch conduit 14, the branch conduit 14 may be sized with a different gauge wire in comparison to the main HV conduit 12. That is, when distributing high voltage, typically all conduits are sized for the same loads and are of a same gauge wire to handle the currents and loads of a main HV circuit. However, certain circuits may not require the same load as the main HV wire and can operate utilizing a lower gauge wire based on the expected loads. Therefore, a lower gauge wire may be utilized in branch circuits where lower current draws are utilized. Consequently, if a respective conduit is tapped off the main HV conduit 12, while the respective conduit may operationally draw lower loads than the HV circuit, overloads may occur where the respective branch conduit experiences higher loads than what the circuit is sized to handle. As a result, protection measures must be utilized in the event a spike or excessive increase in voltage or current occurs when utilizing a smaller gauge conduit than a larger gauge wire used in the HV circuit. As a result, the fuse is incorporated within the branch circuit when using the smaller gauge conduit to prevent an overload condition. Should the circuit experience an overload, the fuse will blow and voltage and current flow is terminated in the branch circuit. Voltage or current flow in the branch circuit will cease until the fuse 26 in the housing 16 is replaced.

As a result of incorporating the fuse 26 within the power distributer 10 while using smaller gauge wiring, the smaller gauge wire reduces the cost of utilizing the larger gauge wire. In addition, a separate junction box is not require that not only requires additional components and is costly, but eliminates the need to designate a location for packaging a junction box and to route conduits to and from the selected location where the junction box would be packaged. Often times, the junction box may not be in a region where it is beneficial to the routing of the branch circuit, but in an area that is sized to accommodate the packaging of the junction box. In contrast, the power distributer 10 may be tapped into the HV wire at essentially any location, and more preferably, a section close to where the branch conduit is required to be routed. This reduces the cost of the wiring by not having to utilize extra wire to couple to and from the junction box in the designated location, which often times is not necessarily the prime location.

Referring again to FIGS. 3 and 4, there is shown a plurality of grounding elements for grounding both the main HV conduit 12 and the branch conduit 14 to the housing 16. A first grounding ring 70 and a second grounding ring 72 are axially spaced from the location where the first conductive coupling device is secured to the main HV conduit 12. To secure the first grounding ring 70 and the second grounding ring 72 to the main HV conduit 12, only respective sections of the jacket 62 are removed from the main HV conduit 12 while leaving the sheath intact to the main HV wire 12. Both the first grounding ring 70 and second grounding ring 72 are secured to the sheath of the main HV conduit 12 by a crimping and/or welding operation as described herein. Each of the rings may be initially formed as flat piece of metal blank and rolled to form the respective ground rings or may be formed as a sleeve and placed over the main HV conduit and inserted into place and crimped and/or welded.

A first ground holder 74 and second ground holder 76 are secured to the housing 16 utilizing fastener 78 and 79, respectively, that includes, but are not limited to screws. Each of the ground holders and screws are conductive to allow grounding of the ground rings via the ground holders and fasteners.

Similarly, a third grounding ring 80 is axially spaced from the location where the second conductive coupling device is secured to the branch conduit 14. To secure the third grounding ring 80 to the branch conduit 14, only a respective section of the jacket 66 is removed from the branch conduit 14 while leaving the sheath intact to the branch conduit 14. The third grounding ring 80 is secured to the sheath of the branch conduit 14 by a crimping and/or welding operation as described herein. The may be initially formed as flat piece of metal blank and rolled to form the respective ground ring or may be formed as a sleeve and placed over the branch conduit and inserted into place and crimped and/or welded.

A third ground holder 82 is secured to the housing 16 utilizing a fastener 84 that includes, but is not limited to screws. The ground holder 82 and screw 84 are conductive to allow grounding of the ground ring 80 via the ground holder 82 and fastener 84.

While certain embodiments of the present invention have been described in detail, those familiar with the art to which this invention relates will recognize various alternative designs and embodiments for practicing the invention as defined by the following claims.

What is claimed is:

1. A power distributor comprising:
    a first conductive coupling device electrically coupled to a bare-wire non-terminating section of a first conduit;
    a second conductive coupling device electrically coupled to a terminating end of a second conduit, the first conduit being a larger gauge than the second conduit;
    a fuse electrically connecting the first conductive coupling device and the second conductive coupling device;
    a housing encasing the first and second conductive coupling devices and the fuse.

2. The power distributor of claim 1 wherein the first conductive coupling device includes a first end for electrically coupling to the bare-wire non-terminating section of the first conduit and a second end for electrically coupling to the fuse.

3. The power distributor of claim 2 wherein the first end is crimped to the bare-wire non-terminating section of the first conduit.

4. The power distributer of claim 3 wherein first end is soldered to the bare-wire non-terminating section of the first conduit.

5. The power distributor of claim 1 wherein the second conductive coupling device includes a first end for electrically coupling to the terminal end of the second conduit and a second end for electrically coupling to the fuse.

6. The power distributor of claim 5 wherein the first end of the second conduit is crimped to the terminal end of the second conduit.

7. The power distributor of claim 5 wherein first end is soldered to the terminal end of the second conduit.

8. The power distributor of claim 1 wherein the housing is a metal housing.

9. The power distributor of claim 1 wherein the housing a plastic housing.

10. The power distributor of claim 9 wherein plastic housing further includes an electromagnetic shield.

11. The power distributor of claim 1 wherein the housing includes a two-piece housing, the two-piece housing including a coupling element to secure the first conductive coupling device, second conductive coupling device, and fuse therein.

12. The power distributor of claim 11 further comprising a plurality of edge seals, the edge seals disposed between mating edges of the two-piece housing for environmentally sealing the housing.

13. The power distributor of claim 1 wherein the housing includes a first aperture and a second aperture, the first aperture and second aperture being axially aligned, the first conduit enters the housing through the first aperture and exits the housing through the second aperture, and wherein the housing further includes a third aperture, the third aperture receiving the terminating end of the second conduit.

14. The power distributor of claim 13 wherein the housing further includes a first sealing element and a second sealing element disposed at the first aperture and second aperture, respectively, to environmentally seal the housing.

15. The power distributor of claim 14 wherein the housing further includes a third sealing element at the third aperture to environmentally seal the third aperture.

16. The power distributor of claim 15 further comprising a plurality of end caps disposed over the first aperture, the second aperture, and the third aperture for retaining each of the sealing elements within the housing.

17. The power distributer of claim 1 wherein the fuse is a replaceable fuse.

18. The power distributer of claim 1 wherein the housing encases the bare non-terminating section of the first conduit, wherein only a predetermined axial length of an insulating jacket, a sheath, and an insulator of the first conduit are removed so that no exposed bare conduit extends outside of the housing.

19. The power distributer of claim 1 further comprising a first grounding element and a second grounding element electrically coupled to a sheath layer of the first conduit and the housing, wherein the first and second grounding elements are axially offset relative to the coupling of the first conductive coupling device on the first conduit.

20. The power distributer of claim 1 further comprising a third grounding element electrically coupled to a sheath layer of the second conduit and the housing, wherein the third grounding element is axially offset relative the coupling of the second conductive device couples on the second conduit.

* * * * *